US006839883B2

(12) United States Patent
Ahrikencheikh

(10) Patent No.: US 6,839,883 B2
(45) Date of Patent: Jan. 4, 2005

(54) DETERMINING SUPPORT LOCATIONS IN A WIRELESS FIXTURE OF A PRINTED CIRCUIT ASSEMBLY TESTER

(75) Inventor: Cherif Ahrikencheikh, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 135 days.

(21) Appl. No.: 10/215,108

(22) Filed: Aug. 8, 2002

(65) Prior Publication Data

US 2004/0031000 A1 Feb. 12, 2004

(51) Int. Cl.$^7$ .............................................. G06F 17/50
(52) U.S. Cl. ............................... 716/1; 716/4; 324/756; 324/757; 324/754
(58) Field of Search ................. 716/1, 4; 324/754–757, 324/761

(56) References Cited

U.S. PATENT DOCUMENTS

| | | | | |
|---|---|---|---|---|
| 4,413,510 A | * | 11/1983 | McCusker et al. | 73/150 A |
| 4,417,779 A | * | 11/1983 | Wilson | 439/325 |
| 6,189,876 B1 | * | 2/2001 | Frazier | 269/21 |
| 6,386,890 B1 | * | 5/2002 | Bhatt et al. | 439/67 |
| 6,628,130 B2 | * | 9/2003 | Williams et al. | 324/755 |
| 6,635,513 B2 | * | 10/2003 | Hensley et al. | 438/117 |
| 6,667,628 B2 | * | 12/2003 | Ahrikencheikh et al. | 324/754 |
| 6,734,690 B1 | * | 5/2004 | Ashby | 324/761 |

OTHER PUBLICATIONS

Cook, Robert D., Young, Warren C., "Advanced Mechanics of Materials", 1985, pp. 72–78, and 237–241.
Al–Shareedah, E.M., Seireg, Ali A., "Use of Undetermined Multipliers in the Solution of Complex Plate Problems", Computers in Mechanical EngineeringMagazine, Nov. 1985, pp. 59–68.

* cited by examiner

Primary Examiner—Stacy A. Whitmore

(57) ABSTRACT

A method for determining the optimum placement of supports on a PCB of a wireless test fixture is presented. In accordance with the invention, an optimum support placement calculator determines the location of maximum deflection based on the boundary conditions and loaded conditions of the board, including the locations and forces of components loaded on the board, including traces and conductive pads, mounting hardware, electrical components, and probes contacting the board. A support is placed at the location of maximum deflection that does not coincide with any component location. The support is then added to the known boundary and loading conditions and the process repeated for additional supports until the amplitude of maximum deflection is below a predetermined maximum deflection threshold.

20 Claims, 14 Drawing Sheets

112

! total number of probes
3097
! probe x-y coordinates
13000 8550
12600 8450
12900 8550
12800 8550
12700 8550
12600 8550
13000 8450
...

114

! total number of probes
3097
! probe x-y coordinates
13000 8550
12600 8450
12900 8550
12800 8550
12700 8550
12600 8550
13000 8450
...
! total number of spacers and retainer screws
65
! x-y coordinates of spacers and retainer screws,
! coordinates start with 0 for retainer screws and 1 for spacers
0 14276 612
0 9161 1362
0 19561 937
0 13361 4162
0 17111 -2518
...
1 5136 247
0 6761 667
1 5086 3947
1 17636 6197

DETERMINING SUPPORT LOCATIONS IN A WIRELESS FIXTURE OF A PRINTED CIRCUIT ASSEMBLY TESTER

FIELD OF THE INVENTION

The present invention pertains generally to fixtures of printed circuit board testers, and more particularly to techniques for determining spacer and standoff locations in wireless test fixtures.

BACKGROUND OF THE INVENTION

Printed circuit assemblies (PCA's) must be tested after manufacture to verify the continuity of the traces between pads and/or vias on the board and/or to verify that any components loaded on the PCA perform within specification.

Printed circuit assemblies testing requires complex tester resources. The tester hardware must be capable of probing conductive pads, vias and traces on the board under test.

Prior art test fixtures typically employed a bed of nails fixture comprising a large number of nail-like test probes having tips that make electrical contact with the nodal points of the circuit to be tested. The test probes are typically spring loaded pins inserted in receptacles that pass through and are secured relative to a supporting plate, hereinafter called the probe plate. The printed circuit is placed on top of the test probes and sealed with a gasket. A vacuum is applied through the test fixture to draw the printed circuit board down onto the spring loaded test probes to ensure good electrical contact. The vacuum is maintained until the testing is complete after which another printed circuit board is placed onto the test fixture for testing.

The test probes are inserted into the receptacles which extend below the lower side of the probe plate. The lower end of the receptacle typically has a wire wrap post. A wire is wrapped about the receptacle post and extends in a point-to-point wiring connection to an interface connector pin inserted into a fixture interface panel. The fixture interface panel is adapted to be connected to an interface receiver of the test electronics analyzer. The point-to-point wiring of each receptacle post to a corresponding interface connector pin involves manually wire wrapping wires between each of the receptacle post and interface connector pin.

With the miniaturization of electrical components, the number of test points in a circuit has risen significantly, making point-to-point wiring for each fixture a labor intensive operation. Automation of this process is not economical because each printed circuit board requires a unique design configuration. Furthermore, as the number of test points increases with shrinking technology, the wiring of the closely adjacent test pins becomes more tedious.

Recent advances in fixture technology has led to the use of wireless fixtures. In a wireless fixture, a fixture printed circuit board (PCB) replaces the wires connecting the tester interface pins to the fixture probes with traces on a printed circuit board. In particular, the tester interface pins (either directly or indirectly through tester adapter probes interfacing to the tester pins) make electrical contact with conductive pads on the bottom side of the fixture PCB. The conductive pads on the bottom side of the fixture PCB electrically connect to conductive pads on the top side of the fixture PCB through traces and vias. One end of the probes of the fixture probe plate makes electrical contact with the conductive pads on the top side of the PCB, while the other end of the probes of the fixture probe plate makes electrical contact with various conductive pads/nodes of the printed circuit board under test. Accordingly, wireless test fixture allows tester pins to make electrical contact with appropriate nodes of the printed circuit board under test without the necessity and complexity of wire-wrap connections.

When a printed circuit board under test is to be tested using a wireless fixture, the tester interface pins (directly or indirectly through tester adapter probes) press on the fixture PCB upward at its bottom conductive pads. Simultaneously, the bottom tips of the fixture probes press against the fixture PCB downward against its top conductive pads. The top tips of the fixture probes press against the bottom conductive pads of the printed circuit board under test. Connectivity problems can occur with this configuration. To this end, if each force exerting on one side of the wireless PCB is balanced along the same line by an equal force exerting on the other side, then the wireless PCB will be subject to compression at the points of application of the forces with no deflection. However, in areas where the force on one side is not balanced by another force on the other side, the wireless PCB will tend to deflect or warp in one direction. Deflections and warps can render the wireless PCB mechanically or electrically defective.

Accordingly, it is advantageous to insert spacers and/or standoffs (also known as "retainer screws") (collectively referred to herein as "supports") in strategic positions on the wireless PCB to prevent the occurrence of PCB deflection and/or warping. In particular, spacers may be inserted to provide support on the top side of the wireless PCB to balance forces from the tester pins (directly or indirectly through the tester adapter probes) at the bottom side of the PCB when there are not enough fixture probes exerting force on the top side of the PCB to provide this balancing. Conversely, standoffs may be inserted to balance the force from fixture probes against the operating side of the PCB when there are not enough from the tester pins (directly or indirectly through tester adapter probes) at the bottom side of the PCB. As known in the art, a standoff is a two-part piece comprising a screw and a threaded socket or hole.

This problem occurs more often than not due to the fact that while the tester interface pins (and/or tester interface adapter probes) are generally arranged in a fixed predetermined pattern that does not change from one PCB design to another, the pattern and number of fixture probes does tend to change from PCB design to PCB design. Typically, there are fewer fixture probes exerting downward force on the top side of the wireless PCB than tester interface pins (and/or test interface adapter probes) exerting upward force on the wireless PCB. Accordingly, spacers and/or standoffs are needed in those areas of the wireless PCB where the downward and upward forces are out of balance.

The placement of spacers and/or standoffs can be problematic. Inserting a spacer and/or standoff at every possible location that the forces of the tester interface pins (and/or tester interface adapter probes) and fixture probes do not counterbalance each other is not a viable solution because this may require drilling several hundreds of holes in the fixture probe plate and inserting hundreds of spacers and/or standoffs when only a few are necessary. This unnecessarily increases the cost and complexity of the fixture.

Accordingly, a need exists for intelligently determining the placement of spacers and/or standoffs for a printed circuit board.

SUMMARY OF THE INVENTION

The present invention is a technique for intelligently determining the placement of supports such as spacers and/or standoffs for a printed circuit board subject to loading conditions. According to the invention, the problem is treated as a standard plate problem. The location of maximum deflection of the PCB under loaded conditions (such that the location also does not coincide with the location of any components on the board) is determined based on the boundary conditions and loading conditions, including the locations of all components (e.g., pads/traces, screws, attachment hardware, and probes contacting the board), and all known forces on the printed circuit board under loaded conditions. A support is placed at the calculated location of maximum deflection in order to eliminate the deflection at that location. The location and applied force of the added support are added to the boundary and loading conditions of the board, and the process may be repeated until the maximum deflection calculated is less than a predetermined maximum deflection threshold.

In an illustrative embodiment, spacers and standoff sockets are placed on the top side of the PCB only. When a standoff is inserted, a screw is screwed from the bottom side of the PCB through a threaded hole in the PCB into the standoff socket which sits on the top side of the PCB. Accordingly, if the amplitude of the point maximum deflection is positive, this indicates that the board is deflecting upward, and therefore a spacer (which pushes down on the board) is inserted; if the amplitude of the maximum deflection is negative, this indicates that the board is deflecting downward, and therefore a standoff (which pulls up on the board) is inserted.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method for intelligently determining the placement of spacers and/or standoffs for a printed circuit board is described in detail hereinafter. Although the invention is described in terms of specific illustrative embodiments, it is to be understood that the embodiments described herein are by way of example only and that the scope of the invention is not intended to be limited thereby.

Figure 1:
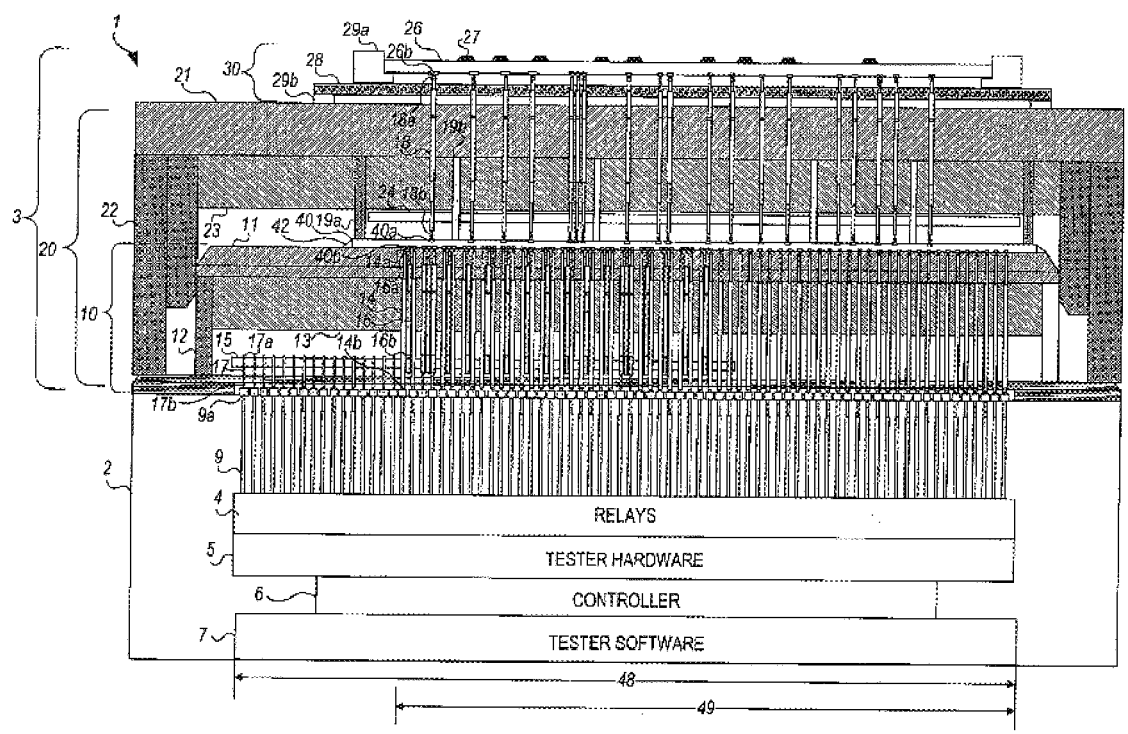
FIG. 1 illustrates a test system utilizing a wireless printed circuit board in accordance with the invention.

Turning now to the invention, FIG. 1 illustrates a test system 1. Test system 1 includes a tester 2, a wireless fixture 3, and a device under test (DUT) mount 30. Tester 2 includes a plurality of test interface pins 9 arranged in an array along the top side of the tester 2. Tester 2 includes tester hardware 5 which operates under the control of a controller 6. Controller 6 may be controlled by tester software 7, which may execute within the tester 2 itself, or remotely via a standard communication interface. One function of the controller 6 is to configure the hardware 5 to make or not make electrical connections between measurement circuits within the tester and each of the test interface pins 9. To this end, each test interface pin 9 is connectable to or isolated from the tester hardware by a relay 4. Electrical contact may be made with a respective test interface pin 9 by closing the relay; conversely, the pin 9 may be isolated from the test hardware by opening the relay 4.

Mounted on top of the tester and over the tester interface pin 9 field is the tester adapter 10. The tester adapter 10 comprises an adapter top plate 11 and an adapter guide plate 13 which together are supported by sidewalls 12. Adapter 10 includes a plurality of solid floating probes 14 that are inserted through precisely aligned holes in the guide/plate 13 and top plate 11. Guide plate 13 ensures precise vertical alignment of solid floating probes 14.

In the embodiment shown, the adapter 10 also includes a probe field shrinking printed circuit board (PCB) 15 which is used to translate the relatively larger field of test interface pins 9 of the tester 2 to a relatively smaller probe field the size of the fixture PCB 40. In particular, in this embodiment, the probe field shrinking PCB 15 comprises a plurality of pins 17 that connect on one end to the top tips of certain test interface pins 9 of the tester and on the other end to conductive traces on the probe field shrinking PCB 15 which route to conductive pads on the top side of the probe field shrinking PCB 15. The adapter includes a plurality of single-ended spring probes 16 whose bottom tips electrically contact the conductive pads on the top side of the probe field shrinking PCB 15. The single-ended spring probes 16 are also inserted through precisely aligned holes in the guide/plate 13 and top plate 11.

The tester adapter 10 is mounted over the test interface pin 9 field such that the bottom tips of the solid floating probes 14 and the bottom tips of the probe field shrinking PCB pins 17 align with and make electrical contact with the top tips of corresponding test interface pins 9 of the tester 2, as shown.

A fixture (wireless) printed circuit board (PCB) 40 is mounted with screws to the probe plate 21, which in turn is attached to the fixture frame 20, such that the top tips of the solid floating probes 14 and the top tips of the single-ended spring probes 16 align with and make electrical contact with conductive pads 40b on the bottom side of the fixture PCB 40. The conductive pads 40 on the bottom side of the fixture PCB 40 electrically connect to conductive pads 40a on the top side of the fixture PCB 40 by traces and vias, and possibly through several intervening conductive layers of the PCB 40.

The fixture frame 20 includes a probe plate 21 and a reinforcement plate 23 supported by sidewalls 22, and an guide plate 24. Fixture frame 20 includes a plurality of double-ended spring probes 18 that are inserted through precisely aligned holes in the probe plate 21, reinforcement plate 23 and guide plate 24. Plastic spacers 19b and/or standoffs 19a prevent deflection and/or warping of the fixture PCB 40 due to imbalanced vertical forces when the assembly is vacuum compressed during test of a PBC under test 26 (hereinafter DUT 26).

Frame 20 is positioned over the fixture adapter 10, precisely aligning the bottom tips of the double-ended spring probes 18 onto conductive pads on the top of the fixture PCB 40 to ensure electrical contact.

The DUT mount 30 includes a support plate 28 mounted on the top side of the frame probe plate 21 by foam or spring gaskets 29b. Foam or spring gaskets 29a are also mounted on the top side of the support plate 28 to allow a DUT 26 such as a printed circuit board to be mounted thereon. The printed circuit board 26 may be loaded, including one or more electrical components 27 attached thereto, or may be a bare board.

When a DUT 26 is to be tested, the tester interface pins 9 press on the fixture PCB 40 upward at its bottom conductive pads 40b (indirectly through the probes 14, 16 of the fixture adapter 10). Simultaneously, the bottom tips of the double-ended probes 18 press against the fixture PCB 40 downward against its top conductive pads 40a. The top tips of the double-ended probes 18 press against the bottom conductive pads 26b of the DUT 26. During test of the DUT 26, the test software 7 directs the controller 6 to configure the tester hardware 5 to make connections between certain tester interface pins 9 of interest to measurement circuits within the tester hardware 5. The tester hardware 5 may then make measurements of the device or pad under test according to software instruction.

The present invention is concerned with the placement of standoffs 19a and/or spacers 19b on the top side of the fixture printed circuit board (PCB) 40. During test, the solid floating probes 14 press on the wireless PCB 40 upward at its bottom pads 40a, and the double-ended spring probes 18 press against the wireless PCB 40 downward at its top pads 40b. If each force exerting on one side of the wireless PCB 40 is balanced along the same line by an equal force exerting on the other side, then the wireless PCB 40 will be subject to compression at the points of application of the forces with no deflection. As described previously, in areas where the force on one side is not balanced by another force on the other side, the wireless PCB 40 will tend to deflect or warp in one direction, which can render the wireless PCB 40 mechanically or electrically defective.

Accordingly, the purpose of the standoffs 19a and/or spacers 19b is to prevent the occurrence of PCB deflection and/or warping by providing supports on the top side to balance the vertical forces on the PCB 40.

In accordance with the invention, the placement of spacers and/or standoffs for printed circuit boards is determined using an intelligent algorithm, discussed hereinafter.

Figure 2:
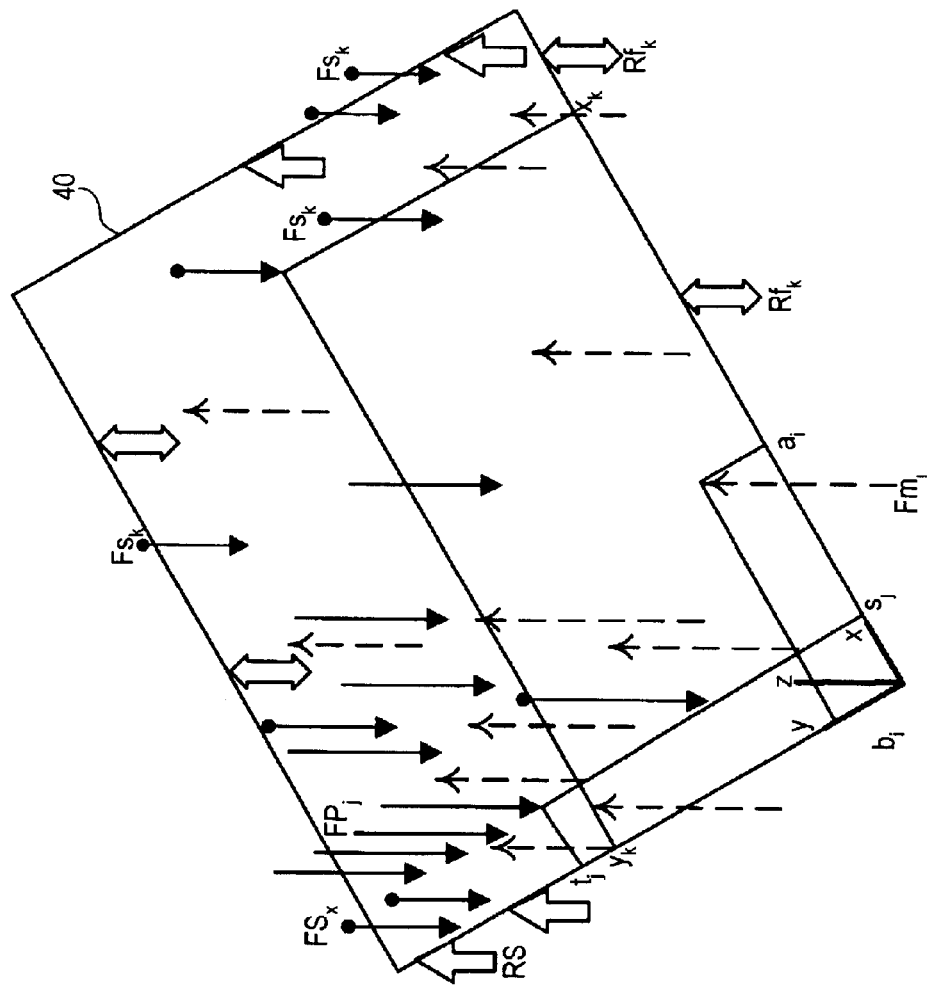
FIG. 2 is a perspective view of a printed circuit board illustrating the different types of forces and supports that a wireless printed circuit board is typically subjected to during test.

FIG. 2 illustrates the different types of forces and supports that a wireless PCB 40 is typically subjected to during test. A coordinate system (x, y, z) is located at a corner of the wireless PCB 40 for convenience of description. As shown, the wireless PCB 40 is subject to several forces.

Force $Fp_j$ is force from the fixture probes acting downward on the wireless PCB at known locations with coordinates $(s_j, t_j, h)$ in the (x, y, z) coordinate system. There is a known number p of such $Fp_j$ forces, and h is the thickness of the PCB 40.

Force $Fm_i$ is force either directly from the test system interface pins 9, or as in the embodiment shown, indirectly through the adapter probes 14, 16, acting upward on the wireless PCB 40 at known locations with coordinates $(a_i, b_i, 0)$ in the (x, y, z) coordinate system. There is a known number m of such $Fm_j$ forces.

Fixed and clamped supports $Rf_k$ and simple supports Rs exist due to screws with known locations along two parallel edges of the wireless PCB 40. There is a known number n of screws.

Force $Fs_k$ is force from the fixed/clamped/simple supports from any standoffs and/or spacers, acting vertically on the wireless PCB 40.

As illustrated, the forces $Fp_j$, $Fm_j$, $Fs_k$ are generally all directed in the direction perpendicular to the plane of the wireless PCB 40 (i.e., in the z-direction). Accordingly, it is safe to theoretically consider that all forces have negligible or null components in the x- and y-directions.

Figure 3:
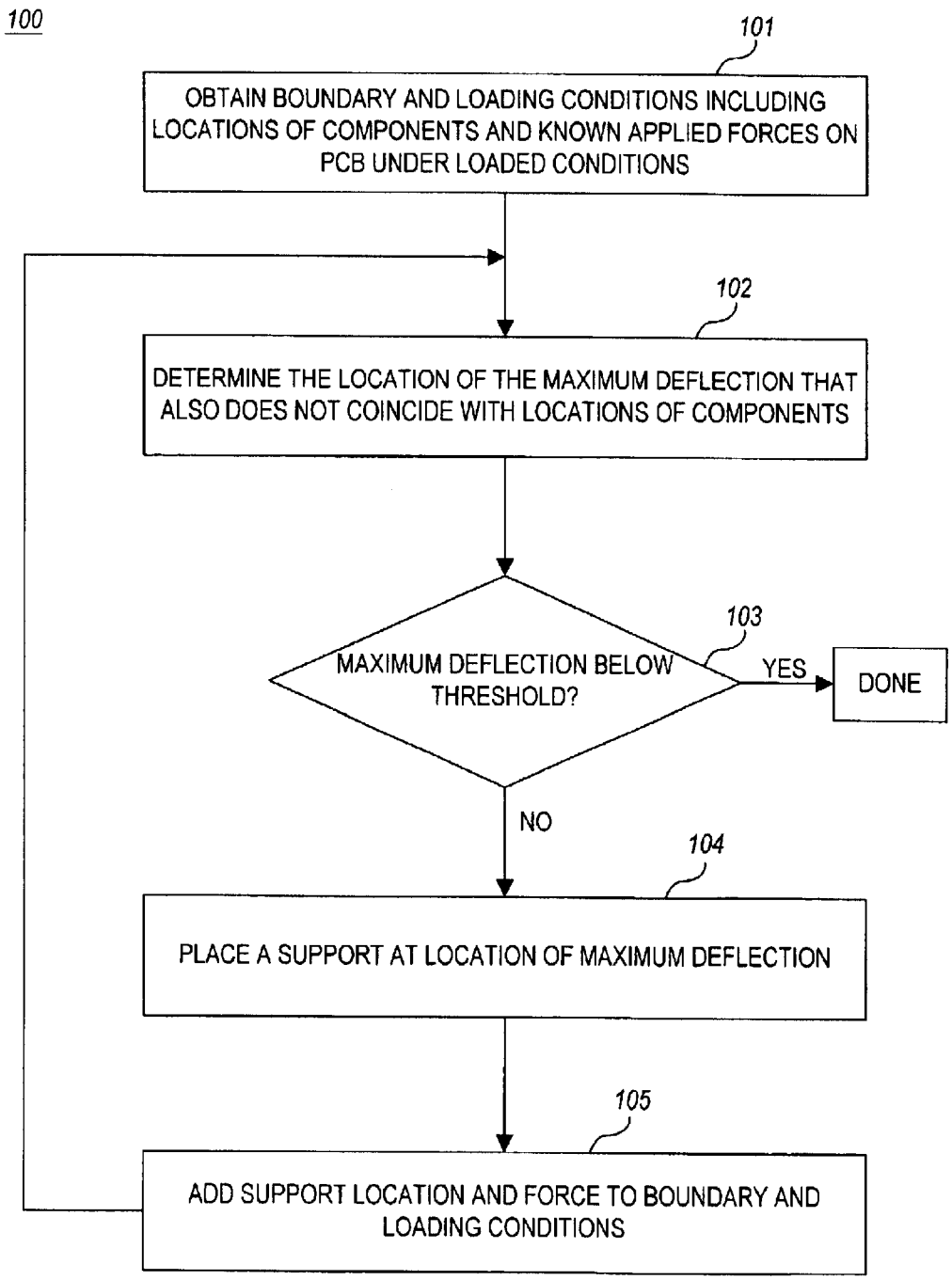
FIG. 3 is a flowchart illustrating the method of the invention.

With these considerations in mind, the problem of finding the optimum locations of spacers and/or retainer screws may be solved according to the method 200 illustrated in FIG. 3. As illustrated, the problem is treated as a standard plate problem. In a first step 101, the boundary conditions and loading conditions are collected. In particular, the locations of all components (e.g., pads/traces, screws, attachment hardware, and probes contacting the board), and all known forces on the printed circuit board under loaded conditions are obtained. Based on the collected boundary conditions and loading conditions, the location of the maximum deflection that also does not coincide with the location of any components is determined 102. In the preferred embodiment, the location of maximum deflection is calculated using a method known as the Ritz variational method using undetermined multipliers in the solution of complex plate problems. However, other techniques, such as Finite Element modeling (FEM) techniques may also be used. In a step 103, a determination is made as to whether the maximum deflection is negligible (i.e., less than or equal to a predetermined maximum deflection threshold value). If not, a support is placed 104 at the location determined in step 102 in order to eliminate the deflection at that location. In the preferred embodiment, spacers and standoff sockets are placed on the top side of the PCB only. When a standoff is inserted, a screw is screwed from the bottom side of the PCB through a hole in the PCB into the standoff socket which sits on the top side of the PCB. The other end of the standoff is screwed into the probe plate 21. Accordingly, if the amplitude of the point maximum deflection is positive, this indicates that the board is deflecting upward, and therefore a spacer (which pushes down on the board) is inserted; if the amplitude of the maximum deflection is negative, this indicates that the board is deflecting downward, and therefore a standoff (which pulls up on the board) is inserted. Thee location and applied force of the added support is added to the boundary and loading conditions of the board in step 105. Steps 102 through 105 are then repeated until the maximum deflection determined in step 103 is less than the predetermined maximum deflection threshold.

Figures 4, 5, 6:
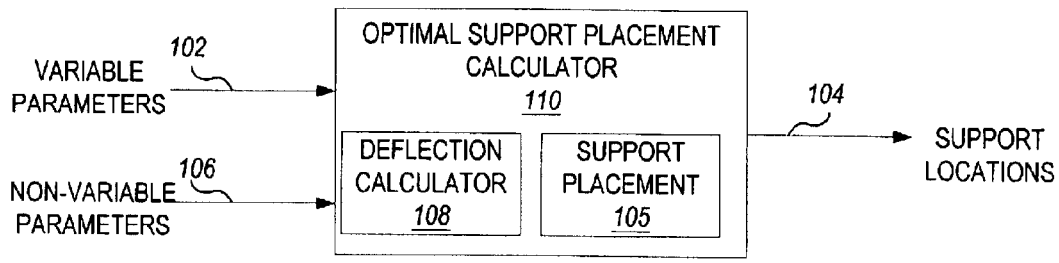
FIG. 4 is a block diagram of a system for calculating optimum placement of supports in a printed circuit board of a wireless test fixture.
FIG. 5 is a sample portion of a variable parameters list for input to the optimum support placement calculator.
FIG. 6 is a sample portion of an output file output by the optimum support placement calculator.

Turning now to an illustrative embodiment, FIG. 4 shows a block diagram of a system for calculating optimum placement of spacers and/or standoffs. As shown, the system includes an optimum support placement calculator 110. The optimum support placement calculator 110 receives a list 102 of variable parameters comprising component locations and/or forces that my vary from DUT design to DUT design (for example, fixture probe locations). The optimum support placement calculator 110 also receives a list 106 of the non-varying parameters (for example, locations/forces of the PCB attachment screws at the edges of the board). Of course, the variable parameters list 102 and non-variable parameters list 106 may coexist in a single file, or be stored in separate files and/or locations in the system.

Based on the variable and non-variable parameters 102 and 106, the optimum support placement calculator 110 calculates the optimum locations for spacers and/or standoffs, and generates an output file 104 which contains at least a list of the spacer and retainer screw locations.

FIG. 5 is a sample portion 112 of a variable parameters list 102 for input to the optimum support placement calculator 110. As illustrated, the PCB under consideration has been segmented into a number of discrete x-y coordinates. The location of every probe and subsequent spacer/standoff may be mapped to one of these x-y coordinates. As illustrated, according to the sample portion 112 of input file 102, the PCB under consideration is contacted by 3097 fixture probes, each exerting a downward force. Because the fixture adapter is generally fixed, the pattern on the bottom of the board is a standard pattern corresponding to, and contacted by, a known number of probes for each wireless PCB. The optimum support placement calculator 110 obtains these unchanging adapter probe locations and the standard force values for each of the adapter probes and fixture probes from a non-variable parameters file 106.

FIG. 6 is a sample portion 114 of an output file 104 output by the optimum support placement calculator 110. As illustrated, the optimum support placement calculator 110 calculated an optimum number of 65 spacers/standoffs, and included the locations of the spacers/standoffs in a list appended to the list of fixture probe locations of the input file 112. As noted in the comments to the output file 114, a 0 precedes the coordinates for retainer screws, and a 1 precedes the coordinates for spacers.

Figure 7:
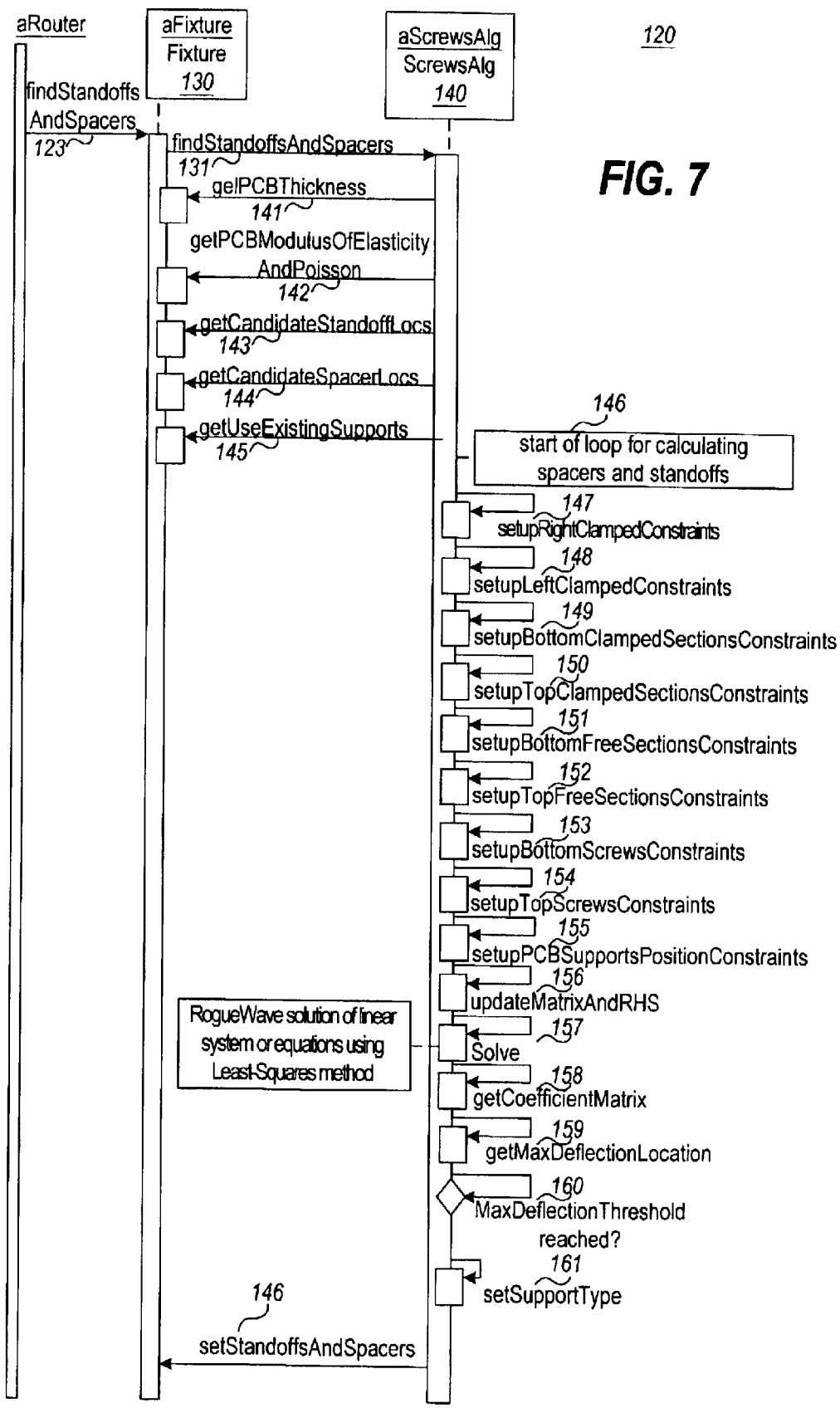
FIG. 7 is a UML sequence diagram of a preferred embodiment of a software version of an optimum support placement calculator implemented in accordance with the invention.

FIG. 7 is a UML diagram of a first embodiment 120 of a software version of the optimum support placement calculator 110 of the invention. In particular, the optimum support placement calculator 120 is modeled as a sequence diagram. In the illustrative embodiment, the optimum support placement calculator is invoked from a router object whose function is to route the PCB. The router object aRouter 122 is an instance of a router class Router. To invoke the optimum support placement calculator, the router object aRouter 122 invokes a method called findStandoffsAndSpacers( ) 123 on a fixture object aFixture 130 of class Fixture. Upon receiving the findStandoffsAndSpacers( ) method 123 invocation, the fixture object aFixture 130 invokes a method called find-StandoffsAndSpacers 131 on a supports algorithm object aSupportsAlg 140 of class SupportsAlg.

Upon receiving the findStandoffsAndSpacers method 131 invocation, the supports algorithm object aSupportsAlg 140 begins to collect the values of the parameters required to solve for the location of maximum deflection. In this regard, the boundary, support, and loading conditions of the PCB under consideration must first be obtained. The parameters required to solve for the location of maximum deflection will depend on the algorithm chosen to solve for the deflection.

Figure 8:
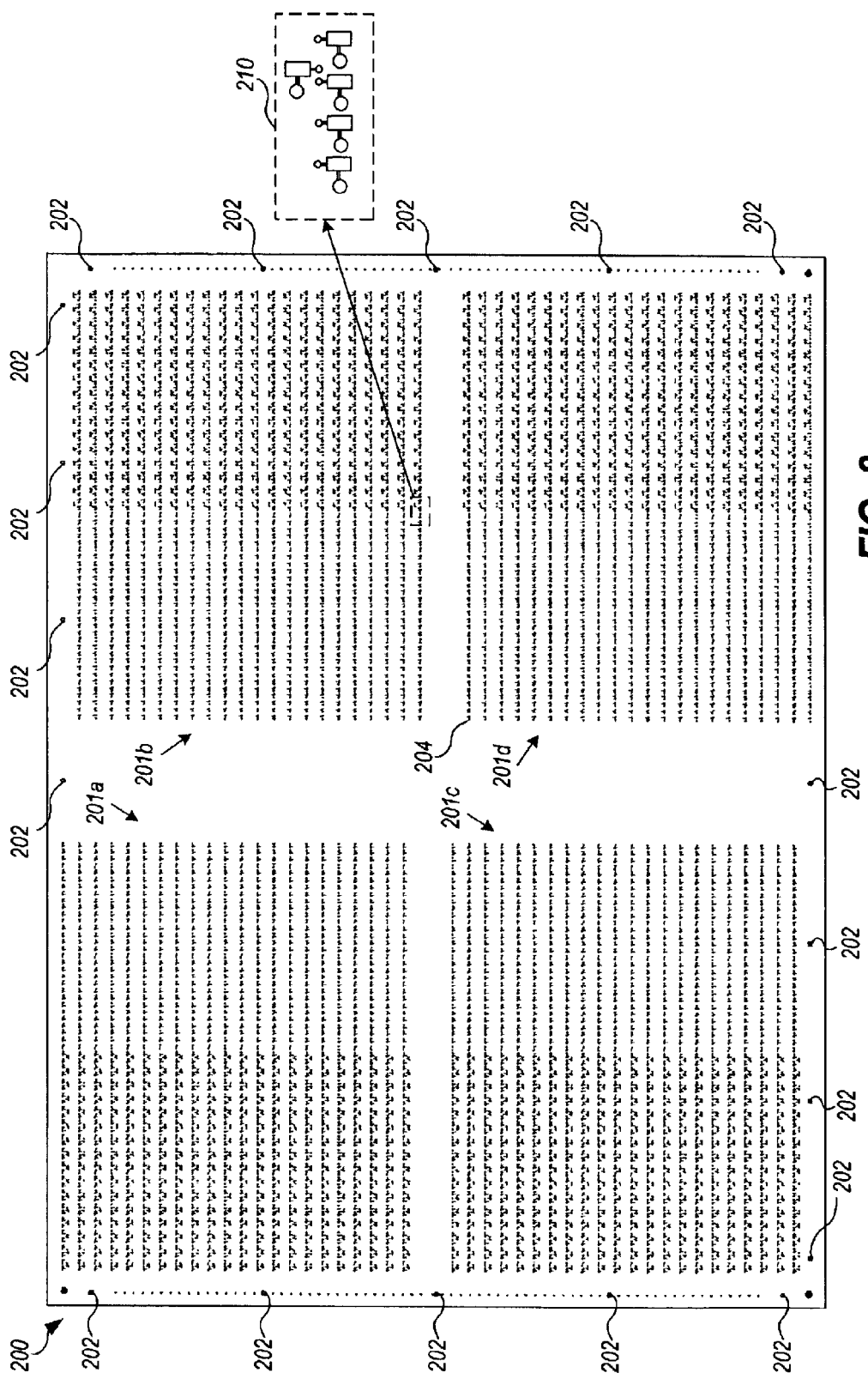
FIG. 8 is a bottom view of an example embodiment of a wireless printed circuit board for use in the test fixture of FIG. 1.

FIG. 8 shows the bottom view of an example embodiment of a wireless printed circuit board 200 for use in the test fixture of FIG. 1. As illustrated, the bottom side of the PCB comprises four arrays 201a–201d of conductive pads 204. These conductive pads 204 connect via traces to conductive pads (not shown) on the top side of the PCB 200. The traces may be routed through several intervening layers, traveling from layer to layer by way of vias. In the illustrative embodiment, the positions of the conductive pads correspond to the positions of the probes 14, 16 of the tester adapter 10. When the fixture frame 20 is positioned on the adapter 10, each probe 14, 16 exactly lines up with and contacts a corresponding respective conductive pad 204 on the fixture PCB 200. Pads 204a–204d are magnified in dashed box 210 for convenience of illustration. To form an electrical connection, the top tip of a given probe 14, 16 of the test adapter 10 physically contacts the round portion of a respective conductive pad.

Figure 9:
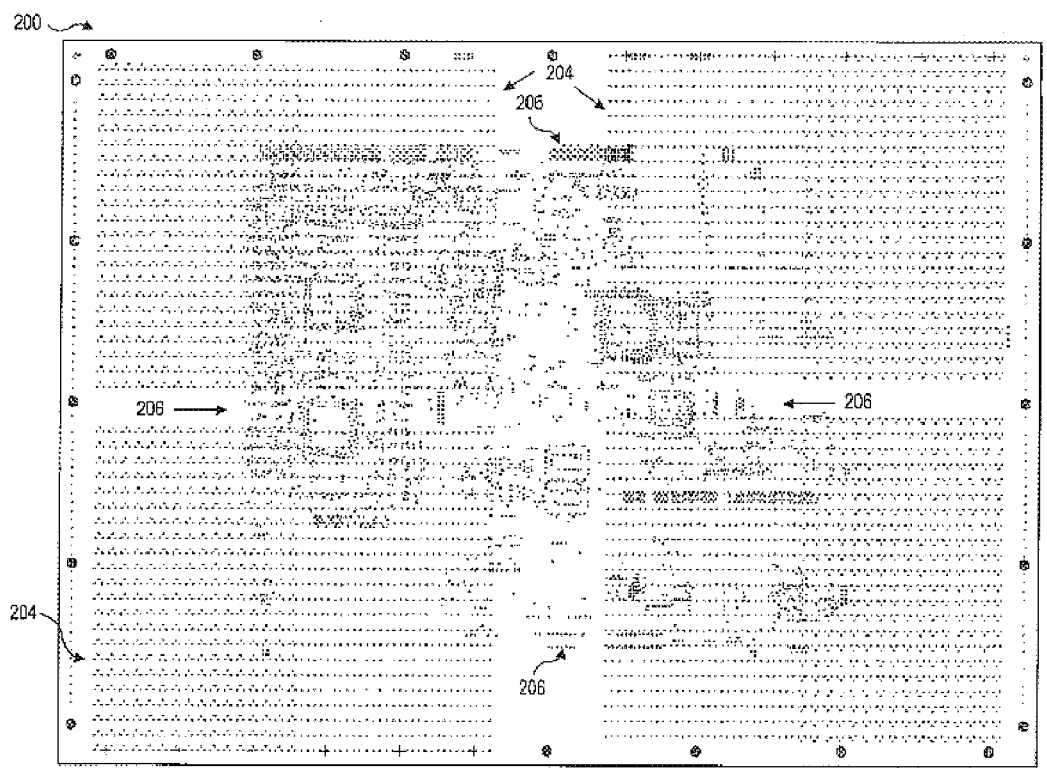
FIG. 9 is a top view of an example embodiment of the wireless printed circuit board of FIG. 8.

FIG. 9 shows the top view of the wireless PCB 200. As illustrated, the top side of the PCB 200 comprises a plurality of conductive pads 206. The bottom conductive pads 204 on the bottom side of the PCB 200 are shown in light grey to illustrate the position of the top conductive pads 206 on the top side of the PCB 200 relative to the position of the bottom conductive pads 204 on the bottom side of the PCB 200. These conductive pads 206 connect via traces to conductive pads 204 (FIG. 9) on the bottom side of the PCB 200. In the illustrative embodiment, the position of the conductive pads 206 correspond to the position of the fixture probes 18 of the fixture 2. When the fixture frame 20 is positioned on the tester over the adapter 10, each probe 18 exactly lines up with and contacts a corresponding respective conductive pad 206 on the top side of the fixture PCB 200.

As illustrated in FIGS. 8 and 9, the PCB includes a number of screw holes 202 at the peripheral edges of the board. These holes are used to attach the PCB 200 to the probe plate 21 using standoffs.

In mechanical engineering, deflection analysis and materials strength analysis, the first thing required to solve for plate deflection is the support (or boundary) conditions. In the illustrative embodiment, the plate (PCB) 200 is supported on all sides by standoffs (screws threaded through the screw holes 202 into standoff sockets). There are potentially four different types of supports that one must consider: clamped, simple, fixed, and free. If a y-parallel edge is clamped, it neither deflects nor rotates, so deflection w=0 and its derivative $\delta w/\delta x=0$. If a y-parallel edge is simply supported, it does not deflect, so deflection w=0 and its stress $\sigma_x=0$ at the edge. If a y-parallel edge is free, the deflection may not be zero since the edge can move transversely.

Each support touching the wireless PCB 200 when mounted in the fixture must be modeled. Equations for modeling the different types of supports are described in Robert D. Cook and Warren C. Young, "Advanced Mechanics of Materials", Macmillan Publishing Company, New York (1985), ISBN 0-02-324620-0, which is incorporated herein by reference for all that it teaches.

In accordance with the above discussion, the supports algorithm object invokes a plurality of methods designed to obtain the boundary condition and loading parameters. These methods are summarized in Table 1.

TABLE 1

| Method Name | Input Parameters | Return Parameters | Description |
|---|---|---|---|
| getPCBThickness | none | The thickness of the PCB of type "double" | Returns the stored value of the PCB thickness, typically 0.093 inch |
| getPCBModulusOfElasticityAndPoisson | none | The modulus of elasticity and Poisson's ratio | Returns the stored value of the Modulus of Elasticity (typically 2.6 Mega PSI) and Poisson's ration (typically 0.3) |
| getCandidateStandoffLocs | PCB width and height, probe and pin locations | Return an array of xy-coordinate points. The coordinates are of type "long" in 1/1000 inch. | Return an array of xy-coordinate points where a standoff can be safely placed to avoid probes as well as pins from the adapter |
| getCandidateSpacerLocs | PCB width and height, probe locations | Return an array of xy-coordinate points. The coordinates are of type "long" in 1/1000 inch. | Return an array of xy-coordinate points where a spacer can be safely placed to avoid probes |
| getUseExistingSupports | none | A Boolean (TRUE or FALSE) | Return whether there is an existing files of spacers and standoffs to account for, instead of starting from scratch |
| setupRightClampedConstraints | none | Matrix and right-hand-side vector | Sets up the equations associated with clamped sections of the PCB in the right edge of the PCB |
| setupLeftClampedConstraints | none | Matrix and right-hand-side vector | Sets up the equations associated with clamped sections of the PCB in the left edge of the PCB |
| setupBottomClampedConstraints | none | Matrix and right-hand-side vector | Sets up the equations associated with clamped sections of the PCB in the bottom edge of the PCB |
| setupTopClampedConstraints | none | Matrix and right-hand-side vector | Sets up the equations associated with clamped sections of the PCB in the top edge of the PCB |
| setupBottomFreeSectionsConstraints | none | Matrix and right-hand-side vector | Sets up the equations associated with free (not supported) sections of the PCB in the bottom edge of the PCB |
| setupTopFreeSectionsConstraints | none | Matrix and right-hand-side vector | Sets up the equations associated with free (not-supported, not fastened) sections of the PCB in the top edge of the PCB |
| setupBottomScrewsConstraints | none | Matrix and right-hand-side vector | Sets up the equations associated with bottom sections of the PCB that are fastened with too few and small screws to be considered "clamped" |
| setupTopScrewsConstraints | none | Matrix and right-hand-side vector | Sets up the equations associated with top sections of the PCB that |

TABLE 1-continued

| Method Name | Input Parameters | Return Parameters | Description |
|---|---|---|---|
| | | | are fastened with too few screws to be considered "clamped" |
| setupPCBsupports PositionConstraints | none | Matrix and right-hand-side vector | Sets up the equations associated with each spacer and standoff |
| updateMatrixAndRHS | small Matrix and right-hand-side vector associated with each constraint type | Large Matrix and right-hand-side vector | Each constraint type (clamped, free, fixed) on each edge is saved as a separated small matrix and right-hand-side vector. This method superposes all such matrices to make a single large matrix and right-hand-side vector to be solved |
| Solve (routine from RogueWave Inc.) | Matrix and right-hand-side vector | Solution of system of equation | Solves a system of linear equations, described in terms of a matrix and a right-hand-side vector |
| getCoefficientMatrix | Vector solution | A two-dimensional array of the coefficients of the deflection function | Extracts from a solution vector the corresponding value of the coefficients of the deflection function |

Following the UML diagram of FIG. 7, the supports algorithm object aSupportAlg 140 of class SupportAlg invokes a method called getPCBThickness 141 on the fixture object, which returns a value representing the thickness of the wireless PCB under consideration. The supports algorithm object aSupportAlg 140 then invokes a method called getPCBModulusOfElasticityAndPoisson 142 on the fixture object, which returns the modulus of elasticity of the PCB material and the Poisson's ratio of the PCB under consideration (i.e., the ratio of transverse to longitudal strain of the PCB material under tension.). The supports algorithm object aSupportAlg 140 then invokes a method called get-CandidateStandoffLocs 143 on the fixture object aFixture 130, which returns a list of possible valid standoff locations (x-y coordinates) on the wireless PCB. In determining the possible valid standoff locations, the fixture object aFixture 130 takes into account the locations of the fixture probes (and therefore the locations of the conductive pads on the top side of the wireless PCB under consideration) as well as the pads on the bottom side of the PCB that will be contacted by the adapter pins. Valid standoff locations exist at any point on the wireless PCB that a standoff will not collide with a fixture probe or contact a conductive pad on the top side of the PCB, and avoids the bottom pads. In the preferred embodiment, the PCB width and height, probe and pin locations are passed to the method, which in turn returns an array of x-y coordinates of locations where a standoff can be safely placed to avoid fixture probes and adapter pins.

The supports algorithm object aSupportAlg 140 then invokes a method called getCandidateSpacerLocs 144 on the fixture object aFixture 130, which returns a list (vector) of possible valid spacer locations (x-y coordinates). In determining the possible valid spacer locations, the fixture object aFixture 130 takes into account the locations of the fixture probes (and therefore the locations of the conducive pads on the top side of the wireless PCB under consideration). Valid spacer locations exist at any point on the top side of the wireless PCB that a spacer will not collide with a fixture probe or contact a conductive pad on the top side of the PCB. In the preferred embodiment, the PCB width and height, and probe locations are passed to the method, which in turn returns an array of x-y coordinates of locations where a spacer can be safely placed to avoid fixture probes.

The supports algorithm object aSupportAlg 140 then invokes a method called getUseExistingSupports 145 on the fixture object aFixture 130, which returns a Boolean value indicating whether or not the supports algorithm should use a file containing locations of known supports on the PCB (i.e., previously calculated locations of spacers and standoffs on the PCB which may be reused from a previous design to avoid redrilling new support holes). (Note: The attachment screws around the peripheral edges are fixed and known and therefore do not need to be calculated as they constitute the initial support conditions of the algorithm.) In this regard, the algorithm can calculate the board deflection from a starting point of known support locations, or can perform the calculations from scratch without prior knowledge of already known support locations.

With the above methods obtaining the global parameters of the wireless PCB under consideration, the supports algorithm object aSupportAlg 140 then begins the standoff/spacer placement calculation loop 146. To accomplish this, the supports algorithm object aSupportAlg 140 begins by building the mathematical model that will be used to solve for the wireless PCB deflection. Accordingly, the support conditions for the wireless PCB under consideration must be set up. The supports algorithm object aSupportAlg 140 invokes the methods called setupRightClampedConstraints 147, setupLeftClampedConstraints 148, setupBottom-ClampedConstraints 149, and setupTopClampedConstraints 150 on the supports algorithm object aSupportAlg 140. The method sets up the linear equations for solving for the location of maximum deflection associated with clamped sections of the PCB on the right-, left-, bottom-, and top-edges of the wireless PCB, respectively.

The supports algorithm object aSupportAlg 140 then invokes the methods called setupBottomFreeSectionsConstraints 151 and setupTopFreeSectionsConstraints 152 on the supports algorithm object aSupportAlg 140. These methods set up the linear equations for solving for the location of maximum deflection associated with free (unsupported) sections of the PCB on the bottom- and top-edges of the wireless PCB, respectively.

The supports algorithm object aSupportAlg 140 invokes methods called setupBottomScrewsConstraints 153 and setupTopScrewsConstraints 154. These methods set up the linear equations for solving for the location of maximum deflection associated with the bottom- and top-edges of the PCB, respectively, that are fastened with too few and/or small screws to be considered "clamped".

The supports algorithm object aSupportAlg 140 invokes a method called setupPCBsupportsPositionConstraints 155, which sets up the linear equations for solving for the location of maximum deflection associated with the spacers and standoffs known so far. As standoffs and spacers locations are calculated, their locations are accumulated as boundary conditions for subsequent iterations.

To determine the deflection profile of the PCB, a polynomial is chosen, a linear system of equations in the form of the chosen polynomial is set up, and then the linear system of equations is solved to determine the coefficients of the chosen polynomial. Given the polynomial solution, coordinates of points of the PCB may be plugged into the solution to determine the deflection at these points. In the preferred embodiment, the chosen polynomial is a relatively high-order (e.g., 12th order) double Fourier sine series polynomial in the form:

$$w(x, y) = \sum_{m=1}^{M} \sum_{n=1}^{N} A_{mn} \sin m\pi/a \times \sin n\pi/by,$$

where 0<=x<=a and 0<=y<=b, and where a is the width (first dimension) of the PCB and b is the height (not thickness, but second dimension) of the PCB.

The method for determining the deflection profile is the Ritz variational method using undetermined multipliers as described in Al-Shareedah, E. M. and Seireg, Ali A., "Use Of Undetermined Multipliers In The Solution Of Complex Plate Problems", Computers in Mechanical Engineering (November, 1985) pp. 59–68, incorporated herein for all that it teaches.

The supports algorithm object aSupportAlg 140 invokes a method called updateMatrixAndRHS 156. The input is a small matrix and right-hand-side vector associated with each type of constraint. Each constraint type (clamped, free, fixed) on each edge is saved as a separate small matrix and right-hand-side vector. The updateMatrixAndRHS method 156 superimposes all input small matrices and right-hand-side vectors to return a single large matrix and right-hand-side vector to be solved. Accordingly, the output is a linear system of equations described in terms of a matrix and right-hand-side vector.

The supports algorithm object aSupportAlg 140 invokes a method called Solve 157, which solves a linear system of equations. In the preferred embodiment, the method Solve is part of a mathematical solutions library implemented by Rogue Wave, Inc., which takes as input the large matrix generated by updateMatrixAndRHS method 156 and generates a solution vector to the linear system of equations represented thereby. In the preferred embodiment, the deflection algorithm is an embodiment of the Ritz variational method, and the equations are setup in the form of a matrix and a right-hand-side vector, all private variables in the class called "SupportsAlg". The value returned by the method Solve 157 is the solution to the linear system of equations which represents the deflection function of the PCB under consideration with the known loading condition up to this iteration.

The supports algorithm object aSupportAlg 140 then invokes a method called getCoefficientMatrix 158 on the fixture object 130, passing the vector solution returned by the method Solve 157. The method getCoefficientMatrix 158 extracts from the solution vector the corresponding value of the coefficients of the deflection function.

At this point, the plate deflection profile is known. The aSupportAlg 140 then invokes a method getMaxDeflectionLocation 159, passing to it the coefficient matrix of the deflection solution. The method getMaxDeflectionLocation 159 evaluates the deflection amplitude, iterating through the coordinates of all known valid support locations. The method getMaxDeflectionLocation 159 then inserts a support at the location of maximum deflection.

Preferably, the supports algorithm includes a conditional statement 160 such that if the maximum deflection is greater than a predetermined maximum deflection threshold, the supports algorithm executes another iteration of the loop 146–159.

Once the maximum deflection is less than (or equal to) a predetermined maximum deflection threshold, the supports algorithm object aSupportAlg 140 invokes a method setSupportType 161, which determines whether each of the added supports should be a spacer or a standoff. To accomplish this, for each added support, the support is removed from the calculations, leaving all others. The deflection at the location of the removed support is then calculated. If the deflection is positive, a spacer is inserted; if the deflection is negative, a standoff is inserted.

Once all of the support locations and support type at each location have been determined, the supports algorithm object aSupportAlg 140 invokes a method called setStandoffsAndSpacers 146 on the fixture object aFixture 130. The method setStandoffsAndSpacers 146 saves the calculated support (spacers and/or standoffs) locations to private variables of the fixture object aFixture 130. Later, when a method for saving the private variable of the fixture object aFixture 130 to a file is invoked (e.g., by the invoking router object aRouter 122), these private variables are appended to the bottom of the input file 102 as in the example embodiment of 112.

FIGS. 10–16 present a graphical illustration of the operation of the optimum support placement calculator 110 of the invention.

Figure 10:
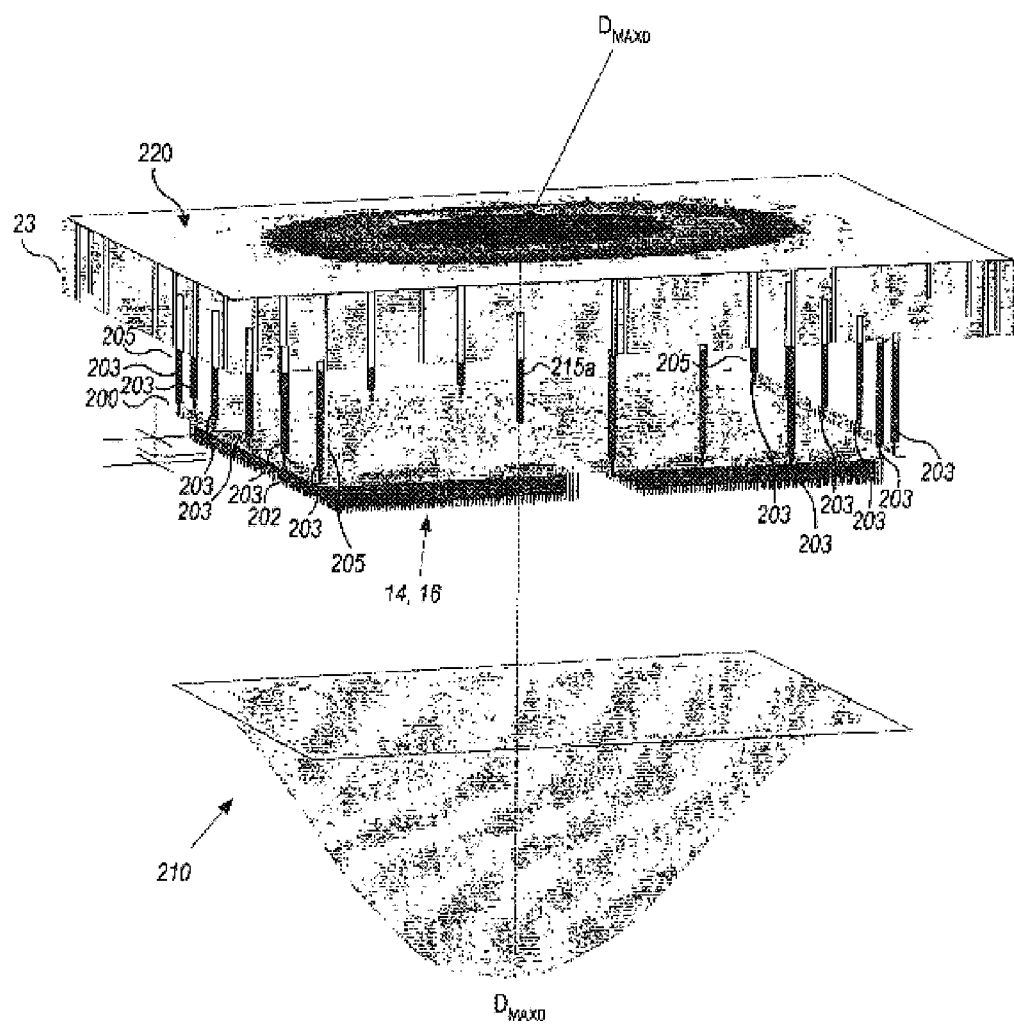
FIG. 10 is a perspective view of the wireless printed circuit board of FIGS. 8–9 under loaded conditions as the first support location is calculated, including a printed circuit board deflection profile.

As shown, FIG. 10 is a perspective view of the wireless PCB 200 of FIGS. 8–9 under loaded conditions. In particular, the PCB 200 is under loaded conditions when it is properly positioned between the probes 14, 16 of the tester interface adapter 10 on the bottom side, and the probes 18 of the fixture 20 on the top side. As illustrated, in the illustrative embodiment, when the wireless PCB 200 is positioned in place between the tester adapter and probes of the probe plate, it is held in place by a plurality of screws 203 positioned through screw holes 202 around the perimeter of the PCB. This is the initial condition attachment of the PCB before standoffs and spacers are added to meet the goal of keeping the PCB parallel to the probe plate 23. Guide dowels 205 may also be employed to guide the PCB 200 in-place with respect to the probe plate 23.

As illustrated, FIG. 10 also includes a PCB deflection profile 210 and probe plate deflection profile 220. As illustrated, the point of maximum deflection $D_{MAX0}$, as indicated by the PCB deflection profile, is near the center of the board. Accordingly, a support 215a is added at the position of maximum deflection.

Figure 11:
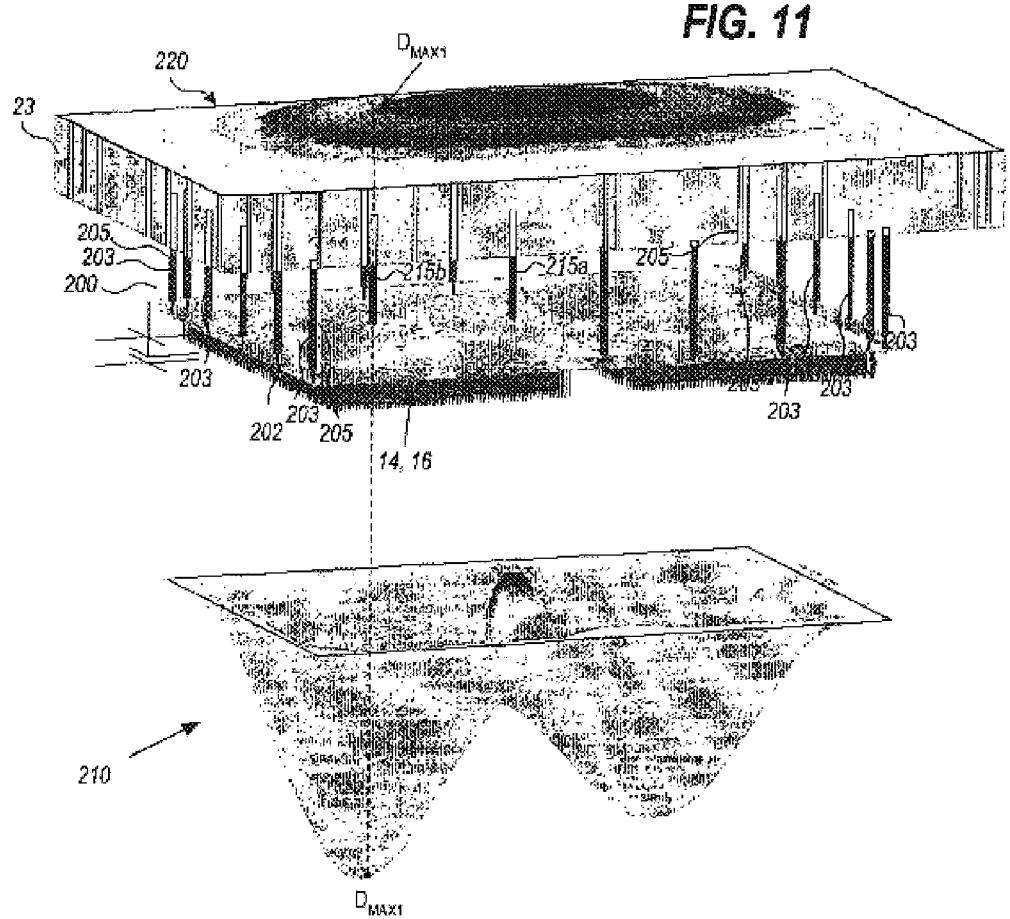
FIG. 11 is a perspective view of the wireless printed circuit board of FIG. 10 under loaded conditions as the second support location is calculated.

FIG. 11 illustrates the deflection model of the wireless PCB 200 and probe plate 23 after one support 215a has been inserted. As shown, there are two peaks of high deflection of the board with one support inserted; however, as indicated by the PCB and probe plate deflection profiles 210 and 220, the point of maximum deflection is at point $D_{MAX1}$. Accordingly, another support 215b is added at the position of maximum deflection.

Figure 12:
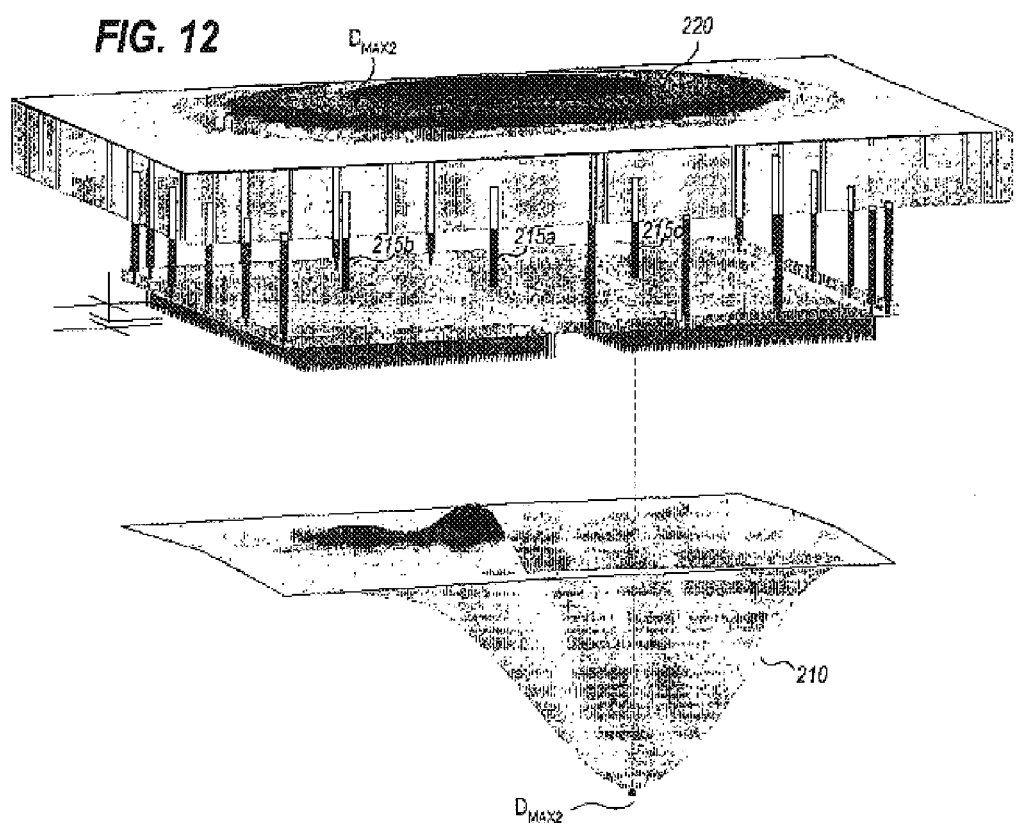
FIG. 12 is a perspective view of the wireless printed circuit board of FIGS. 10–11 under loaded conditions as the third support location is calculated.

FIG. 12 illustrates the deflection model of the wireless PCB 200 and probe plate 23 after two supports 215a, 215b have been inserted. As shown, there is one main peak of high deflection of the board with two support inserted. As indicated by the PCB and probe plate deflection profiles 210 and 220, the point of maximum deflection is at point $D_{MAX2}$. Accordingly, another support is added at the position of maximum deflection.

The space placement algorithm continues to iterate according to the method shown in FIG. 3.

Figure 13:
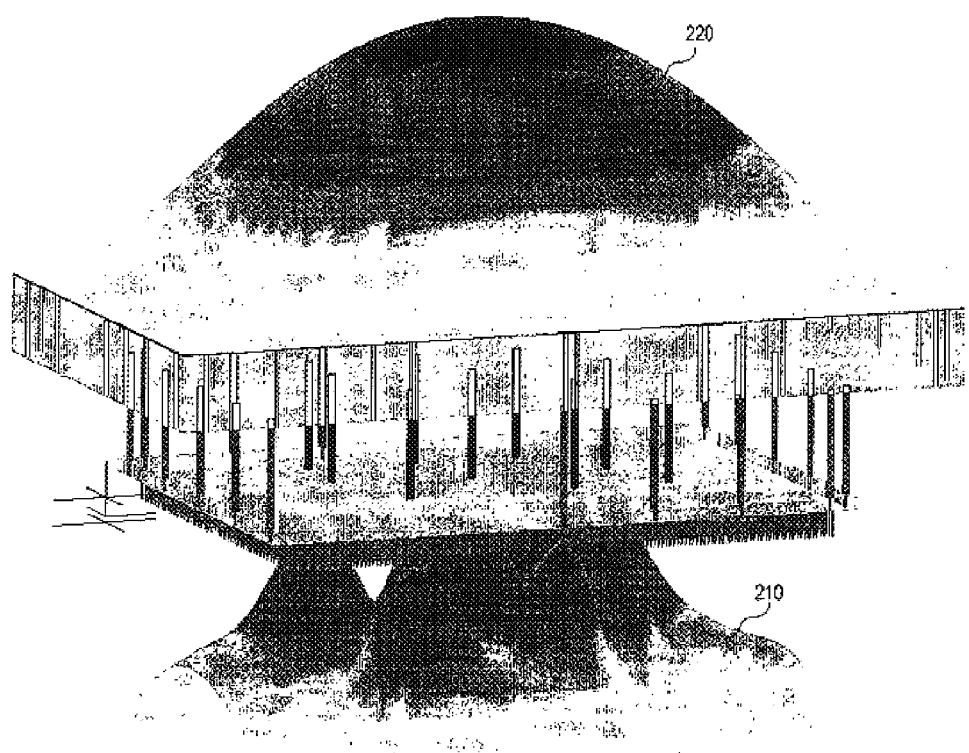
FIG. 13 is a perspective view of the wireless printed circuit board of FIGS. 10–12 under loaded conditions as the ninth support location is calculated.

FIG. 13 illustrates the deflection model of the wireless PCB 200 and probe plate 23 when the location of the ninth support is determined. As shown, the PCB and probe plate deflection profiles 210 and 220 are beginning to look similar.

Figure 14:
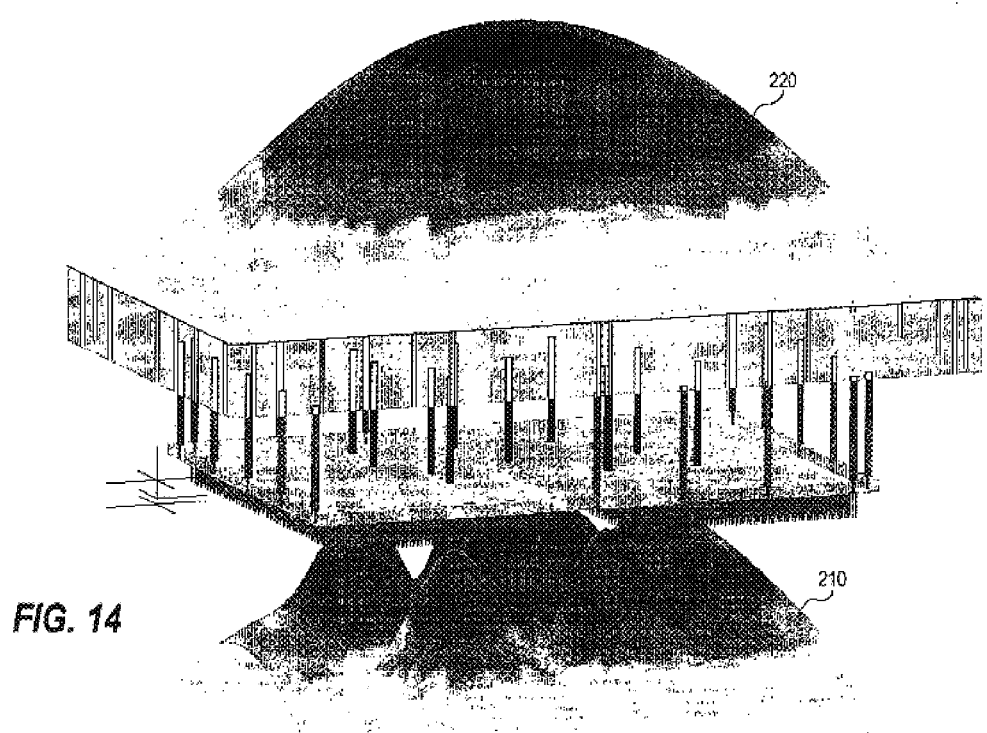
FIG. 14 is a perspective view of the wireless printed circuit board of FIGS. 10–13 under loaded conditions as the tenth support location is calculated.

FIG. 14 illustrates the deflection model of the wireless PCB 200 and probe plate 23 when the location of the tenth support is determined. The PCB and probe plate deflection profiles 210 and 220 are looking even more similar.

Figure 15:
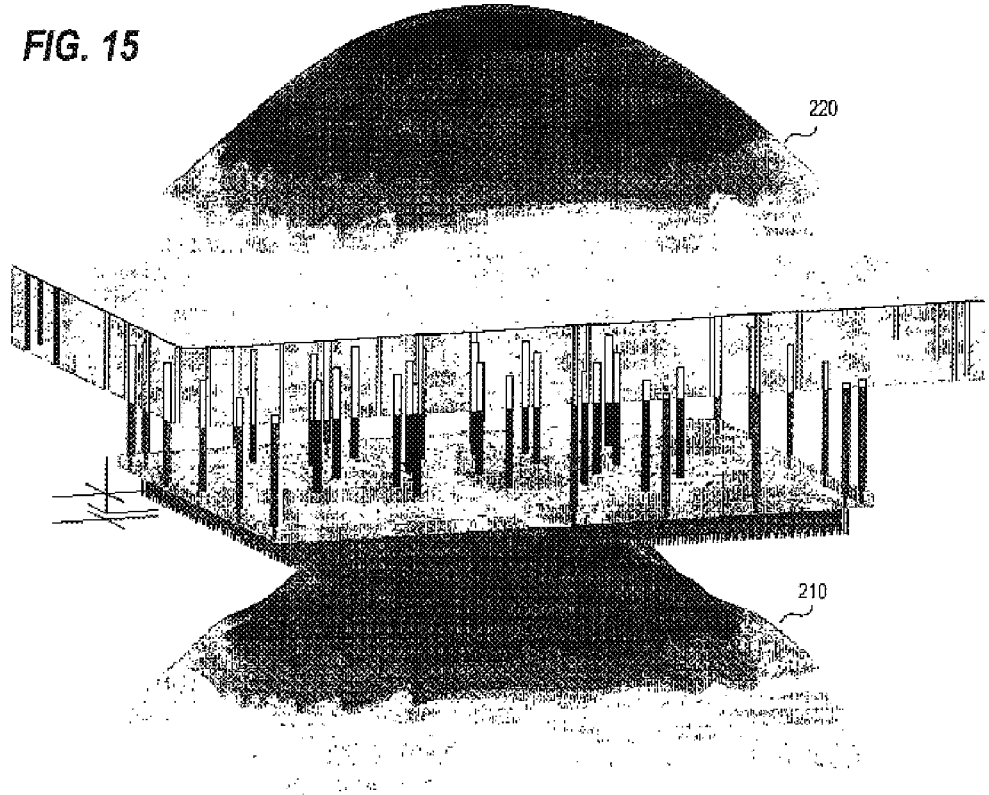
FIG. 15 is a perspective view of the wireless printed circuit board of FIGS. 10–14 under loaded conditions as some intermediate support location is calculated.

FIG. 15 illustrates the PCB and probe plate deflection profiles 210 and 220 when the location of a subsequent intermediate support is determined.

Figure 16:
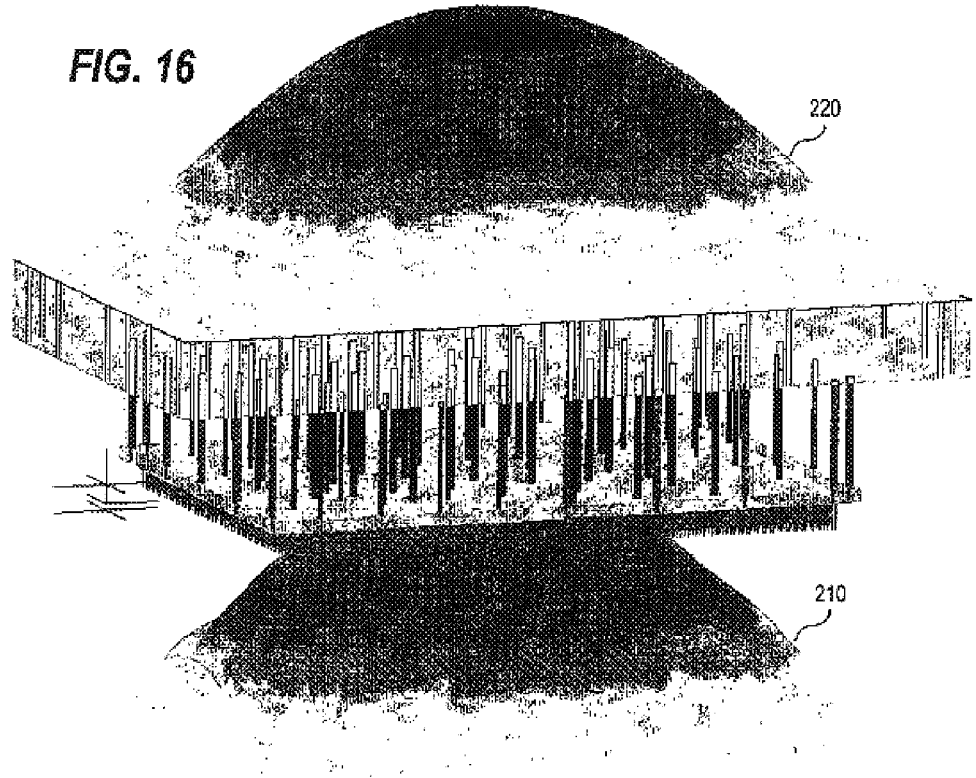
FIG. 16 is a perspective view of the wireless printed circuit board of FIGS. 10–15 under loaded conditions as the last support location is calculated.

FIG. 16 illustrates the PCB and probe plate deflection profiles 210 and 220 when the location of the last support is determined. The PCB and probe plate deflection profiles 210 and 220 look nearly identical.

It is clear from the above description that many advantages are afforded using the optimum support placement calculator of the invention. Support placement is calculated automatically. Only the number of supports required to minimize deflection and/or warping of the fixture PCB are inserted, thereby minimizing cost and complexity of the fixture. In addition, the same placement algorithm may be used from one PCB design to another different PCB design, requiring only the boundary and loading conditions of the PCB under consideration.

Of course, it will be appreciated that the placement of supports is not limited to placement on a single side of the PCB. In an alternative embodiment, supports may be placed on both the top side and bottom side of the PCB. In this embodiment, the locations of the components (including conductive pads, traces, probes or pins that contact the PCB under loaded conditions, screws, clamps, electrical components, etc.) on both sides of the PCB must be obtained. Spacers and/or standoffs can only be inserted in locations of maximum deflection that do not coincide with any of the locations of the components on the side of the board that the support will be placed.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for determining support placement of supports on a first side of a PCB, said PCB being subject to vertical forces in a first direction on said first side of said PCB, and/or to vertical forces in a second direction on said second side of said PCB under loaded conditions, said method comprising:
   obtaining first side component locations on said first side of said PCB, said first side component locations comprising locations on said PCB over which a support cannot be mounted;
   obtaining boundary conditions and loading conditions of said PCB;
   determining a location of maximum deflection on said PCB which does not coincide with any of said first side component locations; and
   allocating placement of a support at said determined location of maximum deflection.

2. A method in accordance with claim 1, further comprising:
   adding said determined location of maximum deflection and an associated force of said support to said boundary conditions and said loading conditions of said PCB; and
   repeating said determining step and said allocating step at least one additional iteration to determine placement of at least one additional support.

3. A method in accordance with claim 1, comprising:
   determining an amplitude of said location of maximum deflection;
   if said amplitude is greater than a predetermined threshold:
      adding said determined location of maximum deflection and an associated force of said support to said boundary conditions and said loading conditions of said PCB; and
   repeating said step for determining a location of maximum deflection through said adding step until said amplitude is less than or equal to said predetermined threshold.

4. A method in accordance with claim 1, wherein said allocating step comprises:
   if a calculated deflection at said location of maximum deflection is in said second direction, allocating said support as a spacer; and
   if said calculated deflection at said location of maximum deflection is in said first direction, allocating said support as a standoff.

5. A method in accordance with claim 1, wherein said step for determining said boundary conditions and said loading conditions of said PCB comprises:
   obtaining respective positions and amplitudes of known vertical forces applied to said first side in said first direction under said loaded conditions; and
   obtaining respective positions and amplitudes of known vertical forces applied to said second side in said second direction under said loaded conditions.

6. A method for placing supports on a first side and/or a second side of a PCB, said PCB being subject to vertical forces in a first direction on said first side of said PCB, and/or to vertical forces in a second direction on said second side of said PCB under loaded conditions, said method comprising:

obtaining first side component locations on said first side of said PCB and/or second side component locations on said second side of said PCB, said first side component locations comprising locations on said PCB over which a support cannot be mounted on said first side and said second side component locations comprising locations on said PCB over which a support cannot be mounted on said second side;

obtaining boundary conditions and loading conditions of said PCB;

determining a location of maximum deflection on said PCB which does not coincide with any of said first side component locations and/or said second side component locations; and allocating placement of a support at said determined location of maximum deflection.

7. A method in accordance with claim 6, wherein said allocating step comprises:
if a calculated deflection at said location of maximum deflection is in said second direction, allocating said support on said first side of said PCB as a spacer; and if said calculated deflection at said location of maximum deflection is in said first direction, allocating said support on said first side of said PCB as a standoff.

8. A method in accordance with claim 6, wherein said allocating step comprises:
if a calculated deflection at said location of maximum deflection is in said second direction, allocating said support on said second side of said PCB as a standoff; and if said calculated deflection at said location of maximum deflection is in said first direction, allocating said support on said second side of said PCB as a spacer.

9. A method in accordance with claim 6, wherein said allocating step comprises:
if a calculated deflection at said location of maximum deflection is in said second direction, allocating said support on said first side of said PCB as a spacer or allocating said support on said second side of said PCB as a standoff; and if said calculated deflection at said location of maximum deflection is in said first direction, allocating said support on said first side of said PCB as a standoff or allocating said support on said second side of said PCB as a spacer.

10. A method in accordance with claim 6, further comprising:
adding said determined location of maximum deflection and an associated force of said support to said boundary conditions and said loading conditions of said PCB; and repeating said determining step and said allocating step at least one additional iteration to determine placement of at least one additional support.

11. A method in accordance with claim 10, wherein said allocating step comprises:
if a calculated deflection at said location of maximum deflection is in said second direction, allocating said support on said first side of said PCB as a spacer; and if said calculated deflection at said location of maximum deflection is in said first direction, allocating said support on said first side of said PCB as a standoff.

12. A method in accordance with claim 10, wherein said allocating step comprises:
if a calculated deflection at said location of maximum deflection is in said second direction, allocating said support on said second side of said PCB as a standoff; and if said calculated deflection at said location of maximum deflection is in said first direction, allocating said support on said second side of said PCB as a spacer.

13. A method in accordance with claim 10, wherein said allocating step comprises:
if a calculated deflection at said location of maximum deflection is in said second direction, allocating said support on said first side of said PCB as a spacer or allocating said support on said second side of said PCB as a standoff; and if said calculated deflection at said location of maximum deflection is in said first direction, allocating said support on said first side of said PCB as a standoff or allocating said support on said second side of said PCB as a spacer.

14. A method in accordance with claim 6, comprising:
determining an amplitude of said location of maximum deflection;

if said amplitude is greater than a predetermined threshold:
adding said determined location of maximum deflection and an associated force of said support to said boundary conditions and said loading conditions of said PCB; and repeating said step for determining a location of maximum deflection through said adding step until said amplitude is less than or equal to said predetermined threshold.

15. A method in accordance with claim 14, wherein said allocating step comprises:
if a calculated deflection at said location of maximum deflection is in said second direction, allocating said support on said first side of said PCB as a spacer; and if said calculated deflection at said location of maximum deflection is in said first direction, allocating said support on said first side of said PCB as a standoff.

16. A method in accordance with claim 14, wherein said allocating step comprises:
if a calculated deflection at said location of maximum deflection is in said second direction, allocating said support on said second side of said PCB as a standoff; and if said calculated deflection at said location of maximum deflection is in said first direction, allocating said support on said second side of said PCB as a spacer.

17. A method in accordance with claim 14, wherein said allocating step comprises:
if a calculated deflection at said location of maximum deflection is in said second direction, allocating said support on said first side of said PCB as a spacer or allocating said support on said second side of said PCB as a standoff; and if said calculated deflection at said location of maximum deflection is in said first direction, allocating said support on said first side of said PCB as a standoff or allocating said support on said second side of said PCB as a spacer.

18. An optimum support placement apparatus for placing supports on a first side and/or a second side of a PCB, said PCB being subject to vertical forces in a first direction on said first side of said PCB, and/or to vertical forces in a second direction on said second side of said PCB under loaded conditions, said apparatus comprising:
a deflection calculator which receives a list of first side component locations on said first side of said PCB and/or a list of second side component locations on said second side of said PCB and a list of boundary conditions and loading conditions of said PCB, said first side component locations comprising locations on said first side of said PCB over which a support cannot be mounted on said first side, and said second side component locations comprising locations on said second side of said PCB over which support cannot be mounted on said second side, wherein said deflection calculator determines a location of maximum deflection on said PCB which does not coincide with any of said first side component locations and/or said second side component locations; and a support placement function which allocates a support at said determined location of maximum deflection.

19. An optimum support placement apparatus in accordance with claim 18, wherein:

said deflection calculator calculates a deflection at said location of maximum deflection; and said support placement function allocates a spacer on said first side of said PCB or allocates a standoff on said second side of said PCB if said calculated deflection at said location of maximum deflection is in said second direction, and allocates a standoff on said first side of said PCB or allocates a spacer on said second side of said PCB if said calculated deflection at said location of maximum deflection is in said first direction.

20. An optimum support placement apparatus in accordance with claim 18, wherein:

a location and force of said allocated support at said location of maximum deflection is added to said boundary conditions and said loading conditions; and at least one additional support is allocated by said support placement function based on a next location of maximum deflection calculated by said deflection calculator using said added boundary conditions.

* * * * *